United States Patent
Zhang et al.

(10) Patent No.: US 7,829,168 B2
(45) Date of Patent: Nov. 9, 2010

(54) METHODS FOR INSPECTING AND OPTIONALLY REWORKING SUMMED PHOTOLITHOGRAPHY PATTERNS RESULTING FROM PLURALLY-OVERLAID PATTERNING STEPS DURING MASS PRODUCTION OF SEMICONDUCTOR DEVICES

(75) Inventors: Xinyu Zhang, Palo Alto, CA (US); Feng-Hong Zhang, Sunnyvale, CA (US)

(73) Assignee: ProMOS Technologies Pte. Ltd., Singapore (SG)

( * ) Notice: Subject to any disclaimer, the term of this patent is extended or adjusted under 35 U.S.C. 154(b) by 392 days.

(21) Appl. No.: 11/943,931

(22) Filed: Nov. 21, 2007

(65) Prior Publication Data

US 2009/0130570 A1    May 21, 2009

(51) Int. Cl.
*B32B 3/02* (2006.01)
*B32B 3/10* (2006.01)

(52) U.S. Cl. .................... 428/64.1; 428/195.1
(58) Field of Classification Search .............. 428/195.1, 428/64.1
See application file for complete search history.

(56) References Cited

U.S. PATENT DOCUMENTS 5,252,414 A * 10/1993 Yamashita et al. ............ 430/22

OTHER PUBLICATIONS

J. Allgair et al., "Taking Aim at the Overlay Metrology Budget for 70 nm," Yield Management Solutions, 2003, pp. 29-34.
B. Schultz et al., "In-chip Overlay Metrology in 90-nm Production," Yield Management Solutions, 2006, pp. 60-63.
M. Dusa et al., "Pitch Doubling Through Dual Patterning Lithography Challenges in Integration and Litho Budgets", Optical Microlithography XX, Proc. of SPIE vol. 6520, 65200G (2007, before the filing date Nov. 21, 2007 of the present application), pp. 65200G-1 through 65200G-10.

* cited by examiner

*Primary Examiner*—Mark F Huff
*Assistant Examiner*—John Ruggles
(74) *Attorney, Agent, or Firm*—Haynes and Boone, LLP

(57) ABSTRACT

A batch of wafers is temporarily stalled during a Double Pattern Technology (DPT) process before a temporary representation of a second of to-be-overlaid patterns is permanently combined with a first of the patterns. Sampled ones of the stalled wafers are inspected to determine if sufficiently close alignment is present between the two patterns. If excessive misalignment is detected (e.g., by SEM microscopy), the second but still temporary pattern representation is erased from all wafers of the batch and the batch is routed for rework and corrected reestablishment of the temporary representation of the second of to-be-overlaid patterns.

10 Claims, 10 Drawing Sheets

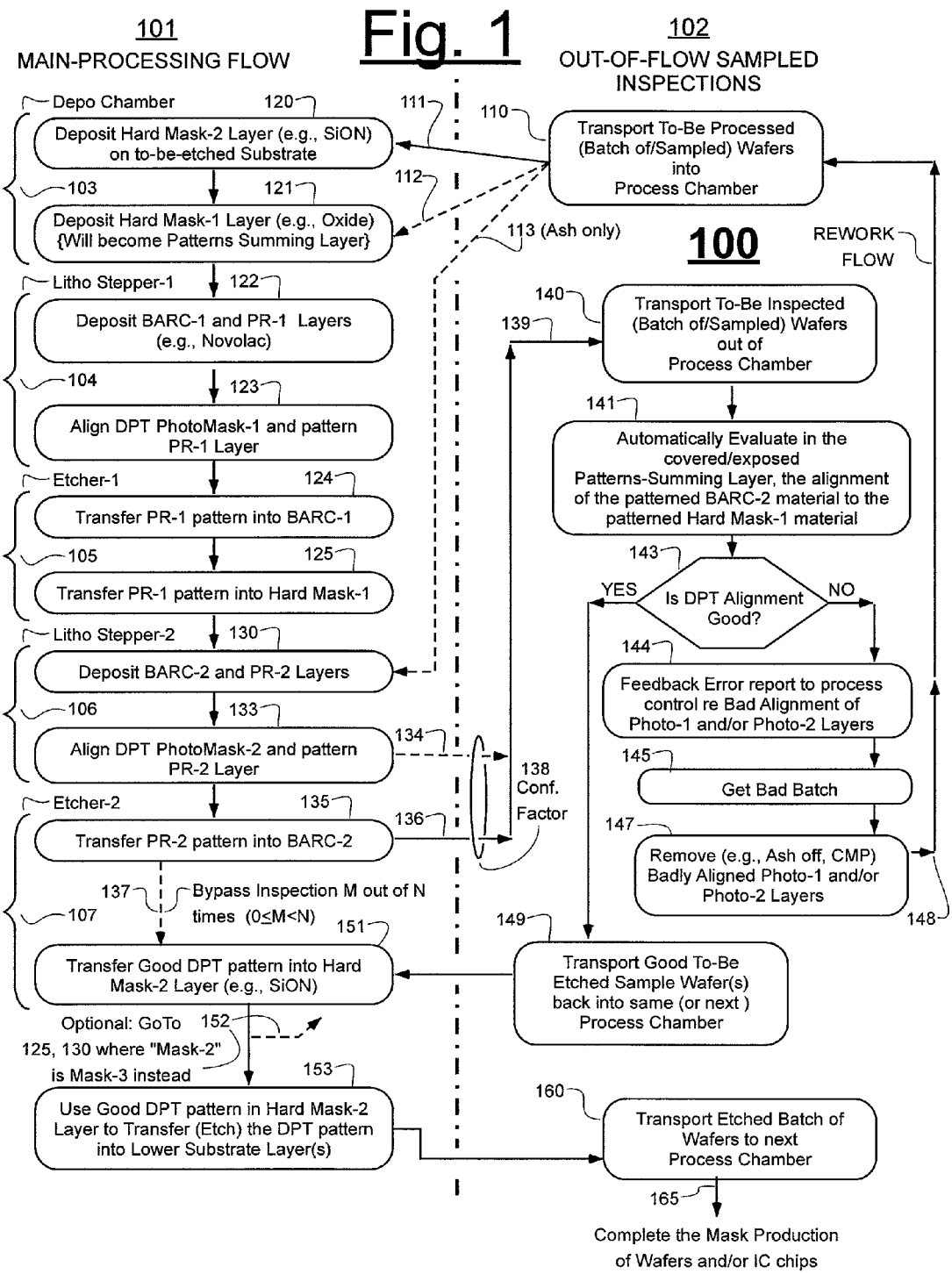

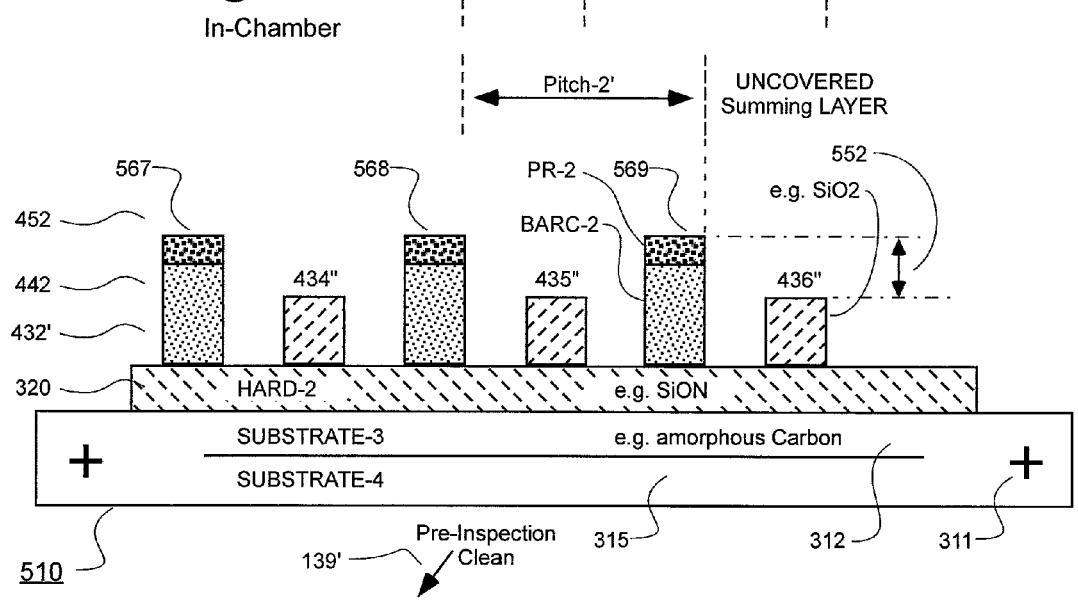
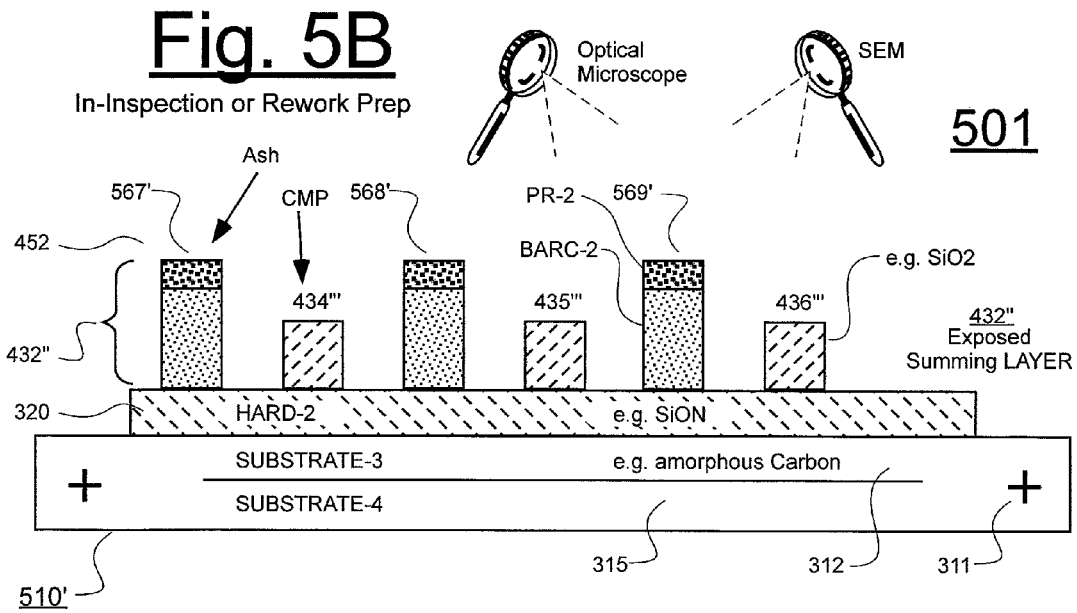

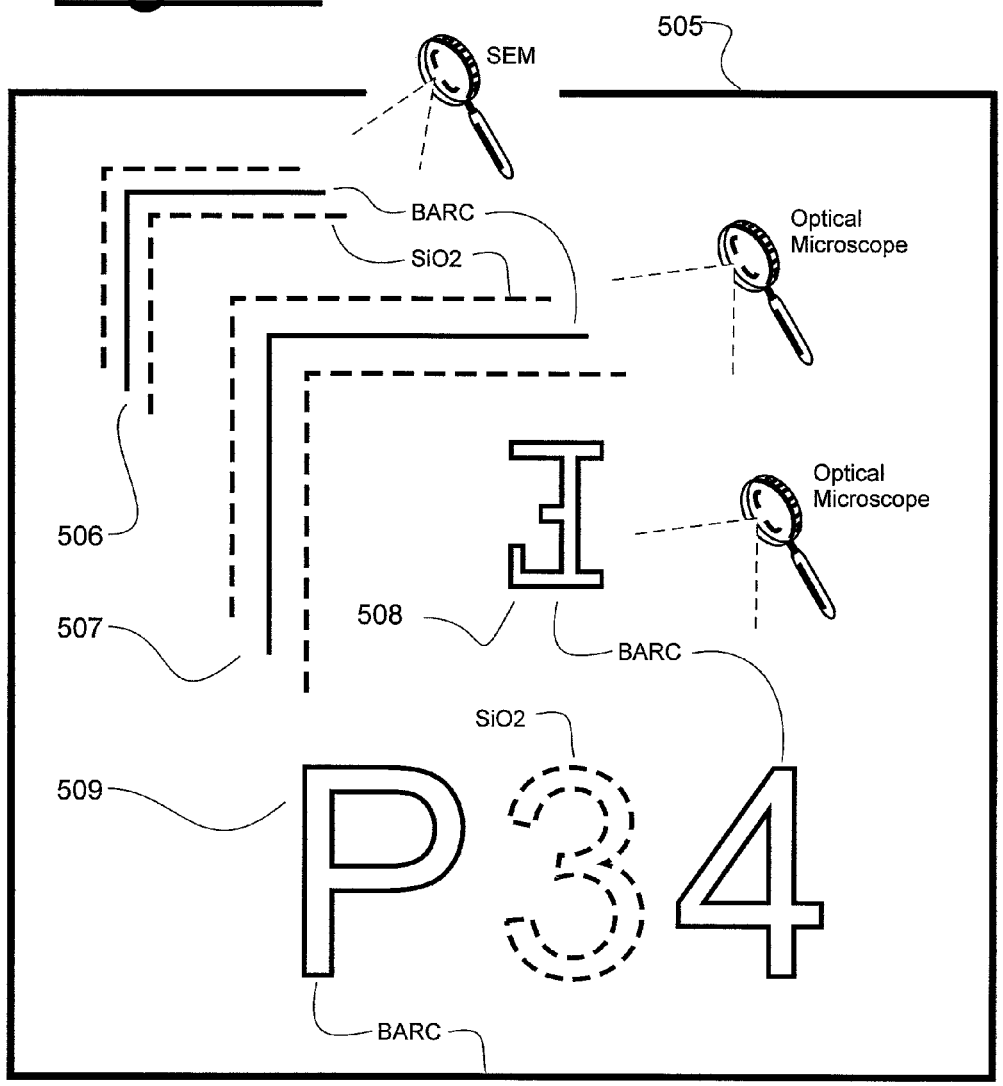

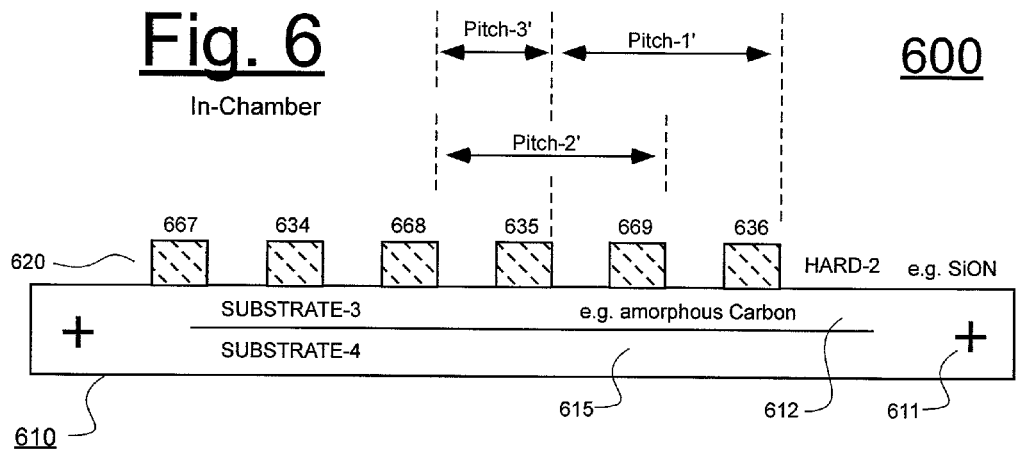
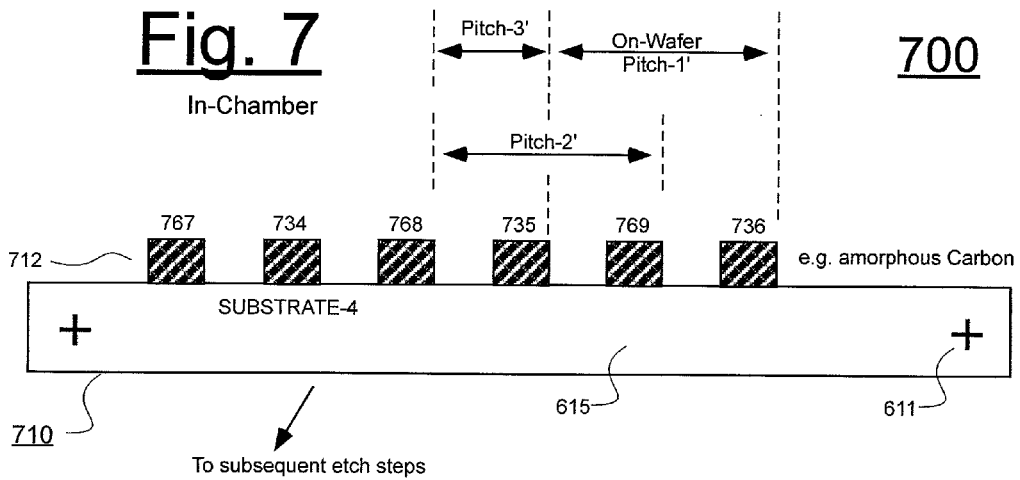

METHODS FOR INSPECTING AND OPTIONALLY REWORKING SUMMED PHOTOLITHOGRAPHY PATTERNS RESULTING FROM PLURALLY-OVERLAID PATTERNING STEPS DURING MASS PRODUCTION OF SEMICONDUCTOR DEVICES

FIELD OF DISCLOSURE

The present disclosure of invention relates generally to multi-mask overlaying techniques such as DPT (Double Pattern Technology) when used in mass production. The disclosure relates more specifically to methods of sampled verification and/or improvement of alignment of multi-mask overlaid patterns formed during mass production of monolithic integrated circuits (IC's) and the like.

CROSS REFERENCE TO PATENTS

The disclosure of the following U.S. patent is incorporated herein by reference:
(A) U.S. Pat. No. 7,241,538 B1, issued Jul. 10, 2007 to Feng-Hong Zhang et al. and entitled "Method for Providing Representative Features for Use in Inspection of Photolithography Mask and for Use in Inspection of Photo-lithographically Developed and/or Patterned Wafer Layers, and Products of Same".

DESCRIPTION OF RELATED TECHNOLOGY

A modern, mass-produced monolithic integrated circuit device (IC) is often a technical wonderment representing the accumulated work efforts of many mass production and pattern miniaturization technologies including but not limited to miniaturized photolithographic patterning of a base substrate layer (e.g., monocrystalline silicon), miniaturized photolithographic patterning of a first gate layer (e.g., polycrystalline silicon), miniaturized photolithographic patterning of a first dielectric layer (e.g., silicon dioxide), miniaturized photolithographic patterning of a first metal interconnect layer (e.g., aluminum) and so forth.

The degree of reliable miniaturization that can be accomplished on a mass production line and at each level depends on many factors, where the factors typically include the available resolution of the photolithographic stepper machine being used to process the work-in-progress structure (in-process IC) at each step along the mass production line. Not all steppers can resolve to a same smallest critical dimension. For example, older steppers might be able to resolve to no finer of a line-to-line pitch dimension than say, 200 nanometers while newer, more modern ones might be able to resolve down to say, 100 nm. The tighter resolutions of the newer machines may render the older steppers obsolete as technology advances and requires finer and finer patterning resolutions. This leaves factories that have purchased older steppers and distributed these along the factory production line in a quandary. The pre-stocked factories have all the older machines (paid-for capital assets) lying around and yet they might not be able to use the older machines for production when competing against newer facilities that have just purchased the latest steppers without being hamstrung by capital investment in older steppers.

Recently, a new technique has emerged that allows for a halving of line-to-line pitch dimensions. It is called DPT (Double Pattern Technology). It allows a stepper with say, only 200 nm of finest line-to-line resolution capability to behave as if it nonetheless had 100 nm of finest resolution capability. It allows a stepper with 100 nm of finest resolution capability to behave as if it nonetheless had, say 50 nm of finest resolution capability.

According to the basic DPT approach, two photomasks are created for patterning a single layer of a wafer in process. The two photomasks are displaced relative to one another and relative to alignment markings on the wafer so as to effect a line-to-line pitch distance equal to, in one example, half the stepper's finest resolution capability; thereby doubling the stepper's apparent line-to-line resolution. In some instances it may be possible to use three overlaid photomasks and thus triple an older steppers capability and so on. The present disclosure is not to be viewed as being limited to just doubling even though that is the process which is more prominently exemplified herein.

During the DPT process, light exposure through the effectively stagger-wise overlaid photomasks is performed using one photomask at a time and one photoresist development step at a time. Patterns of the second overlay photomask have to be precisely aligned so as to be correctly displaced relative to the earlier developed patterns of the first overlay mask. Achieving this high degree of precision can be difficult. Alignments can drift over time due to temperature changes and/or due to drifts in other environmental factors. Lithography results can also shift due to changed input materials and/or drifting process parameters. Often it is discovered too late in a mass production operation that two overlaid masks (of a given production step) were excessively misaligned relative to one another and/or were excessively misaligned relative to other layers of an in-process wafer. The misalignment can be in terms of excessive amounts of translation distance and/or excessive amounts of angular displacement where the one or more excessive misalignment amounts exceed a predefined set of mass production tolerances. Alternatively, something may have gone wrong in the exposure step or post-exposure development step (e.g., baking) for one of the multiple overlaid photomasks. In either case, the in-process wafers with such problems normally have to be discarded and production yields may suffer significantly as a result.

SUMMARY

A method in accordance with the present disclosure of invention creates an in-process integrated circuit structure where the patterns of overlaid masks of a plurally-overlaid patternings method are simultaneously observable and/or simultaneously exposed in a so-called temporary summing layer. The temporary patterns summing layer (TPSL) of the in-process structure is made available for inspection by high resolution optical microscope techniques, and by higher resolution SEM (scanning electron microscope) techniques or the like.

In one embodiment, the plural patterns in the temporary patterns summing layer (TPSL) are respectively composed of different materials so that the materials of the respective patterns can be distinguished one from the next by means of optical microscope inspection and by means of SEM inspection, or by other forms of coarse and finer inspection.

In one embodiment, the plural patterns in the temporary summing layer are furthermore respectively composed of different materials which can be easily erased away (e.g., ashed away and/or ground away with CMP for example—chemical mechanical polishing). This way, if inspection shows the patterns in the temporary patterns summing layer (TPSL) to be excessively misaligned relative to one another or otherwise not properly formed, one or both of the patterns in the TPSL can be erased away and the otherwise still usable in-process IC can be recycled for rework purposes. On the other hand, if inspection shows the patterns of the temporary patterns summing layer (TPSL) to be within predefined tolerance specifications, the summed patterns of the overlaid photomasks can be transferred to underlying substrate layers and the good in-process IC structure can proceed to subsequent mass production stations for further work and ultimate conversion into an operable IC.

In one embodiment, the plurally-overlaid patterning method comprises the steps of:

(a) depositing on a supplied substrate, a base hard mask layer (Hard-2) composed of a base material that is capable of capturing an overlaid multi-mask pattern from a temporary patterns summing layer produced above it and that is capable of withstanding partial or full erasure (e.g., via ashing or CMP) of the temporary summing layer;

(b) depositing on the Hard-2 layer, a temporary hard mask layer (Hard-1) composed of a mask material that is capable of capturing a pattern corresponding to one of plurally overlaid masks and is capable of being selectively preferentially etched relative to exposed portions of the base hard mask layer (Hard-2), and where the temporary hard mask layer (Hard-1) is further capable of having its captured pattern easily erased (e.g., via CMP;—where patterned parts of this Hard-1 layer will later become parts of a temporary patterns summing layer or TPSL);

(c) depositing on the Hard-1 layer, a first organic anti-reflection material layer (BARC-1);

(d) depositing on the BARC-1 layer, a first photosensitive resist layer (PR-1);

(e) exposing the PR-1 layer to a first light pattern as defined by a first photomask of a predefined set of plural, to-be-overlaid photomasks;

(f) developing the exposed PR-1 layer and transferring its first pattern to the BARC-1 layer so as to define a first patterning of BARC-1 material;

(g) transferring the first patterning of the patterned BARC-1 material into the Hard-1 material layer so as to thereby define a first part of the temporary patterns summing layer in the form of the patterned Hard-1 material;

(h) depositing on the patterned Hard-1 material, a second organic anti-reflection material layer (BARC-2) that covers the patterned Hard-1 material;

(i) depositing on the BARC-2 layer, a second photosensitive resist layer (PR-2);

(j) exposing the PR-2 layer to a second pattern as defined by a second photomask of the predefined set of plural, to-be-overlaid photomasks;

(k) developing the exposed PR-2 material layer and transferring its second pattern to the BARC-2 layer so as to define the correspondingly patterned BARC-1 material as forming part of the patterns summing layer; and (l) inspecting the temporary patterns summing layer (TPSL) while the patterns summing layer contains an exposed combination of the patterned BARC-2 material and the patterned Hard-1 material.

The method of the above described one embodiment can include the refinement where said inspecting step (l) includes use of a scanning electron microscope (SEM) to inspect the exposed combination of differently patterned different materials in the temporary patterns summing layer. The method of the above described one embodiment can alternatively or additionally include the refinement where said inspecting step (l) includes use of an optical microscope (OM) to inspect the exposed combination of differently patterned different materials in the TPSL. The method can further include the step of (m) removing from the substrate one or both of the patterns in the TPSL (e.g., either the BARC-2 alone or the combination of the patterned BARC-2 material and the patterned Hard-1 material) if the inspecting step (l) indicates an unacceptable error; and repeating above steps (b) through (k). In one embodiment, CMP is used for removing (erasing) the patterned Hard-1 material and the base hard mask layer (Hard-2) is composed of a selective polish stop material such as a nitride. In one embodiment, ashing is used for removing (erasing) the patterned BARC-2 material while leaving as preserved the patterned Hard-1 material in the temporary patterns summing layer (TPSL).

The method of the above described one embodiment can include the refinement where said repeating above steps (b) through (k) includes modifying an alignment of at least one of the first and second photomasks in the predefined set of plural, to-be-overlaid photomasks in response to an error indication obtained from the inspecting step (l).

The method of the above described one embodiment can further include the step of (n) transferring the summed overlay pattern defined in the temporary patterns summing layer (TPSL) to the underlying Hard-2 layer. The method can further include the step of (o) transferring the patterning formed in the Hard-2 layer to one or more underlying substrate layers. In one embodiment, an amorphous carbon layer underlies the Hard-2 layer.

A batch of in-process integrated circuit structures in accordance with the disclosure may be characterized as being temporarily stalled in an etch chamber while a randomly selected one or more sample and representative wafers from the stalled batch are removed from the etch chamber and transferred to an overlay patterning inspection station where the sampled representative wafers each includes a temporary patterns summing layer (TPSL) having an exposed combination of patterned BARC-2 material and patterned Hard-1 material, and where the pattern of the patterned Hard-1 material corresponds to a first of plurally-overlaid masks; and further where the pattern of the patterned BARC-2 material corresponds to a second of plurally-overlaid masks. If inspection shows the sampled wafers to be good (not excessively misaligned in the TPSL), the represented batch is advanced to a next stage where the summed patterns in their TPSL's are transferred to a lower substrate layer. Plural batches of post-inspection in-process IC structures in accordance with the disclosure may be characterized as having a fewer number of excessive misalignments in layers thereof that are formed by plurally-overlaid masks technology than such plural batches would have had if they did not have sampled ones of their TPSL's inspected and if excessively misaligned ones of the batches were not selectively pulled out from the mass production flow and optionally reworked and/or if the mass production line were not readjusted in response to excessive misalignments uncovered by the TPSL inspections.

Other aspects of the disclosure will become apparent from the below detailed description.

BRIEF DESCRIPTION OF THE DRAWINGS

The below detailed description section makes reference to the accompanying drawings, in which:

FIG. 1 is a flow chart illustrating methods used during mass production of corresponding semiconductor devices for inspecting and optionally reworking in-process substrates where the substrates have exposed thereon a temporary patterns summing layer (TPSL) resulting from plurally-overlaid patterning steps;

FIG. 2A is a schematic diagram providing some background information regarding photomasks, reticles, in-die areas, in-scribe areas and the like;

FIG. 5A is a cross sectional side view showing results of a fifth set of steps including development of a second photoresist (PR-2) layer and transfer of the PR-2 pattern to an underlying BARC-2 layer;

FIG. 5B is a cross sectional side view similar to FIG. 5A, but directed to explaining details of various out-of-chamber inspection and rework techniques that may be employed;

FIG. 5C is a top plan view of a first set of L-bar patterns that may be used in in-scribe sections of the temporary patterns summing layer of an in-process IC for verifying alignment of the overlaid patterns by one or both of optical microscope techniques and higher resolution SEM (scanning electron microscope) techniques;

FIG. 6 is a cross sectional side view showing results of a sixth set of steps including transfer of the verified overlaid patterns of FIG. 5B to an underlying HARD-2 layer; and FIG. 7 is a cross sectional side view showing results of a seventh set of steps including transfer of the verified overlaid patterns of FIG. 6 to an underlying carbon layer.

DETAILED DESCRIPTION

Details of various plurally-overlaid patterning methods will be discussed with reference to the flow chart of FIG. 1 and concomitant examples of different stages will be illustrated by way of sectional views such as in FIGS. 3A-5B and 6-7.

Figure 2A:
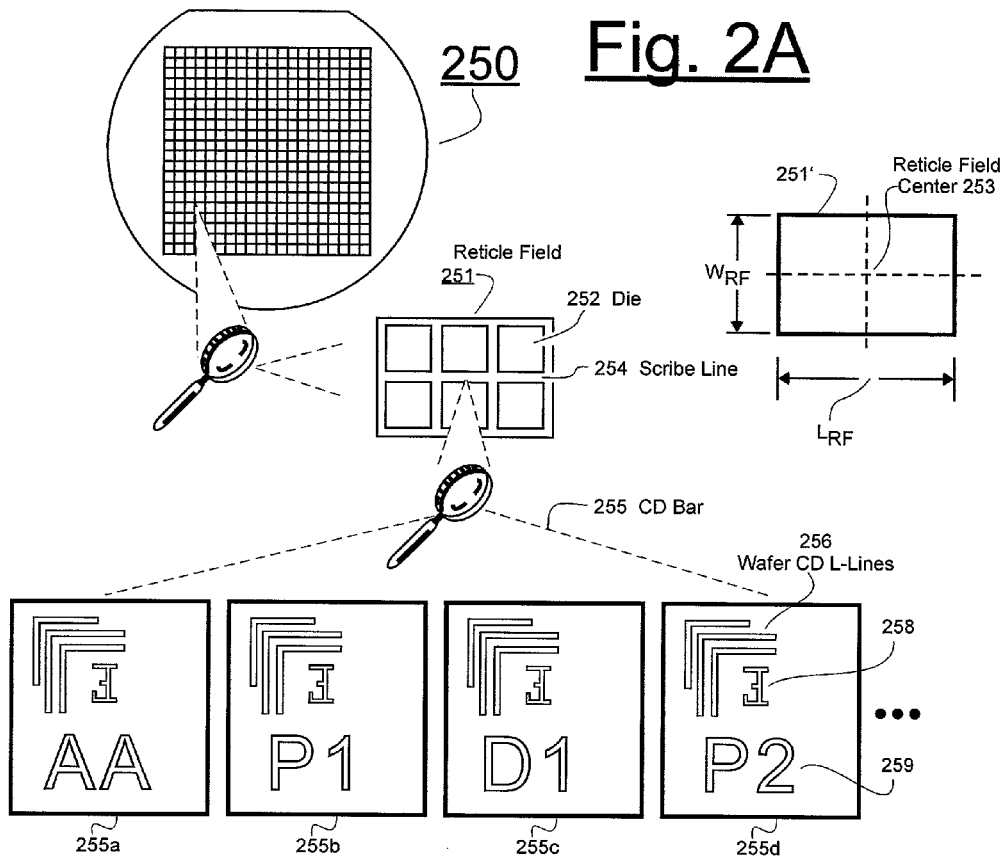
Figure 2B:
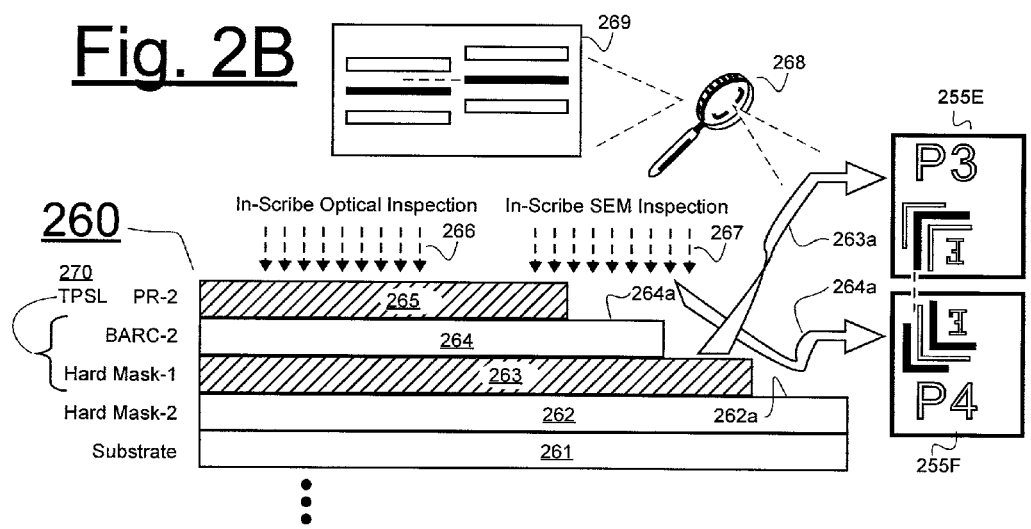
FIG. 2B is a cross sectional side view for illustrating conceptually how in-scribe alignment patterns of overlaid masks may be inspected by one or both of optical microscopy techniques and electron scanning techniques.

However, before delving into the technical details, reference is made to FIGS. 2A-2B for providing some additional background. FIG. 2A schematically shows a series of top plan views of a finished integrated circuits wafer 250 and of certain features that may seen on the wafer and/or found within the multiple layers of the finished wafer 250. More specifically, the finished wafer may be seen to have repeated features that are tiled one adjacent to the next so as to give the wafer an appearance of having streets running north-to-south and east-to-west with congested building sections placed between the relatively empty streets. Each of the building sections is conventionally referred to as a "die" or "chip". Each of the linear and relatively empty streets is conventionally referred to as a "scribe line". When manufacture of the wafer is essentially complete, it is scribed along its scribe lines and broken up into individual dice. The individual dice may be later hermetically sealed into ceramic or plastic packages and sold as individual, functional IC devices. Since the areas of the scribe lines are typically destroyed, such areas are usually devoid of functional (operable) circuitry used in the sold functional IC devices.

First blush recognition of the locations of the individual dice and the scribe lines can be somewhat misleading. (Typically an optical microscope is needed to see them with the human eye.) Actually, the wafer 250 is more accurately pictured as being divided into sections known as reticle fields, where each reticle field has two or more dice. An example of a reticle field is shown at 251. The illustrated field 251 contains six (6) dice, with the square denoted as 252 representing one of those dice. The six exemplary dice are arranged as a 3-by-2 rectangular array. Otherwise configured arrays can, of course, be formed to define a reticle. The exemplary array in field 251 has at least one horizontal scribe line 254 extending through roughly the middle of the reticle field and a number of vertical scribe lines extending through the reticle field in locations that are also spaced away from the edges of the reticle field 251.

The reticle field 251 may be crudely thought of as an imprint that is left behind by an inked stamp which was sequentially stepped across the wafer so as to stamp out the series of dice and scribe lines shown at 250. That however is still not a fully accurate picture because the wafer 250 is comprised of a series of different layers stacked one on top of the other. This is shown conceptually in the cross-section of FIG. 2B. (It will later be understood that layers 263 and 264 are not merely stacked one on top of the other, but rather that, in accordance with the disclosure, they vertically overlap each other to define a temporary patterns summing layer TPSL 270 when certain teachings of this disclosure are followed.) The on-wafer reticle field 251 may be better pictured as a stacked series of stamps whose respective patterns have been stepped across the respective stacked layers (e.g., 261-265 of FIG. 2B) of the wafer as the wafer was moved along from one layer processing station to the next along a mass production line. A different "stamp" may have been used for each of the different layers of the wafer. More specifically, for purposes of this disclosure, it will be seen that according to a DPT technique, two or more overlaid stamps are used to imprint a fine resolution pattern in a single layer (e.g., into layer 262). In the example of FIG. 2B, the bottommost layer 261 may include many sublayers including a monocrystalline silicon layer which is sometimes known as the AA layer or the "active area" layer of an integrated circuit. Another sublayer (not shown) positioned further above the AA layer may be a first polysilicon layer or P1 layer. (Typically, a thin gate oxide layer is interposed between the active layer and the P1 sublayer.) A yet higher sublayer may represent a first inter-poly dielectric layer (the D1 sublayer). Such a D1 sublayer may be used for separating floating and control gates in a stacked flash memory device. A next higher sublayer may represent a second polysilicon layer (P2) and the yet higher layer 65 may define a second dielectric material (a D2 layer, not shown) and so forth.

There are typically many layers composed of different materials in a finished integrated circuit chip. Additionally, during mass production fabrication, many scaffolding layers (sacrificial layers) are built up and thereafter destroyed so as not to appear in the final product. Yet these scaffolding layers often play vital roles in assuring that the ultimate functional layers of the finished integrated circuit chip are properly dimensioned and oriented relative to one another so as to cause the chip to operate as intended.

Among the formed scaffolding parts are so called CD alignment pattern boxes (e.g., 255a, 255b, etc) that take shape in the in-scribe areas (streets) of the wafer 250 during production. These CD alignment pattern boxes (e.g., 255a, etc.) are ultimately destroyed during scribing. Additionally during fabrication, before the wafer 250 is fully formed, other types of alignment pattern boxes (e.g., 255E, 255F) may come into being in temporary sacrificial layers such as the illustrated layers 263 and 264 of FIG. 2B. It is to be understood that FIG. 2B is merely illustrative of a concept and that the final or intermediate layers of an in-process wafer do not have to stepped back from one another at the edge as is shown to the right in the figure. The stepped back or staircase formation separately exposes the temporary alignment pattern boxes (e.g., 255E, 255F) for simultaneous inspection. Even if not peeled back in staircase formation, sometimes one alignment pattern box can be optically seen by shining a light through a higher semitransparent layer if the upper film is thin enough and the layers (e.g., 263, 264) are composed of optically distinguishable materials. The step-like structure shown at 260 is merely for better explaining here how optical and scanning electron inspection techniques may differ from one another. Electron scanning generally requires that the simultaneous inspectable pattern boxes (e.g., 255E, 255F) be simultaneously exposed whereas optical inspection of both may sometimes take place even though one of the two layers is covered.

Referring again to FIG. 2A, each die 252 within the wafer reticle field 251 may be more precisely thought of as being composed of a large plurality of complicated circuit cells that are tiled adjacent to one another like puzzle pieces. The adjoined puzzle pieces form the compiled structure of the die 252. Each circuit cell (not shown) has a corresponding length dimension and a width dimension. These length and width dimensions can change as the circuit cell is designed and redesigned for different purposes. Often it is useful to use the geometric center of each reticle as a reference point for specifying where different features of its internal cells are located because the corner locations are subject to change during design and development. When the design of a wafer reticle field (see now representation 251' instead of 251) is finished, its total length, $L_{RF}$ is equal to the sum of the individual lengths of the different circuit cells that fill a horizontal row across the reticle field 51'. Similarly, the total width, $W_{RF}$ is equal to the sum of the individual widths of the circuit cells that fill a given column within the reticle field. The reticle field is normally always shaped as a rectangle and thus its center can be located for example, as being the intersection point of its diagonals.

When two or more different reticle patterns are to be staggered with one another and overlaid within a same functional layer, it is very important to make sure that the respective centers of their reticle patterns are properly positioned relative to one another and that there is no excessive translational or angular misalignment. To this end, respective overlay alignment patterns (e.g., 255E, 255F) may be simultaneously inspected to verify that alignment is within predefined specifications.

FIG. 2A shows yet another feature that may be found on an in-process wafer. It shows that the central scribe lines (254, and/or other scribe lines) of each reticle field 251 may include a structure known as the "CD bar" 255. The CD bar structure 255 may be comprised of a plurality of respective CD (critical dimension) verifying boxes like 255a, 255b, etc. positioned in the respective sublayers 261, etc., and also positioned from a top plan view perspective, one next to the other. Each CD box 255a typically includes an on-wafer plurality of CD L-shaped lines such as shown at 256 for example. These on-wafer CD lines 256 may be used for confirming that certain critical dimensions of the respective layer of the wafer are properly formed after the wafer layer has been patterned. The typical CD box (e.g., 255a) will also include an automatic alignment mark such as shown at 258. The automatic alignment mark 258 allows automatic alignment equipment (that has been appropriately programmed) to find the on-wafer mark 258 automatically and quickly, for example by use of low power optical microscopy and interoperative pattern recognizing software. The alignment mark may have a design which is very different from the backwards-facing E shown at 258. The design of the alignment mark may vary according to specific needs or features of different, automatic alignment locating tools and their associated software.

The typical CD box (e.g., 255d) will also include macroscopically sized and human-readable indicia such as shown at 259. Such human-readable indicia 259 may be used by a technician looking through a low power optical microscope or by eye to determine which layer now forms the topmost layer of the in-process wafer and which layers have been formed before-hand and in what sequence. When a new layer is defined on the in-process wafer, the CD box 255c of the previous layer is often positioned immediately adjacent to, and visibly alongside the CD box of the next new layer. A visible sequence of CD boxes is therefore created as the in-process wafer moves from one processing stage to the next. So simply by finding the visible human-readable indicia 259 of the last CD box in a sequence 255 of such boxes, the technician can determine which layer is topmost. (Even if one or more lower layers are covered by opaque material, the technician should still know the sequence of layers and he/she should know which one will routinely be topmost. For example, it is apparent that P2 is above P1.) More specifically, if the active layer of an in-process wafer 260 is currently the topmost layer, then the M layer box 255a will be visible at surface. Later, when a layer 262 is defined over layer 261, the first CD box 255a may disappear or it may remain visible alongside in the CD bar area 255 and the new alignment (e.g., of area 262a, box not shown) will show up at surface area of the in-process wafer and in the CD bar area 255. A yet further alignment box will form in region 263a of the next layer 263 when that next layer 263 is defined, and so on.

In line with this concept, if patterns on layers 263 and 264 are to be tightly aligned to one another because they represent overlaid patterns, it is desirable to have their respective CD bar verifying boxes, 255E and 255F, very close to one another so that a microscopic inspection means 268 (e.g., SEM or optical microscope) can use the top plan exposure view (e.g., 269) to verify the desired tight alignment between the patterns on layers 263 and 264. However, since in the conceptual illustration, layers 263 and 264 reside in different lateral planes, one above the other rather than within a same plane; it may not be possible to perform a good SEM or optical microscope inspection simultaneously of the patterns on layers 263 and 264. For example, if the top layer 264 is very thick and optically opaque (as is often the case with organic ARC material—antireflection coating material), the optical microscope may not be able to see through top layer 264 to underlying portions of layer 263. Additionally or alternatively, if the top layer 264 is very thick and the focal depth of the optical microscope (represented by symbol 266) is relatively thin, the optical inspection step may not be able to simultaneously provide sharp focus for the patterns in both of layers 263 and 264.

On the other hand, when SEM or other particle scanning inspection (e.g., 267) is desired, if the patterns of both of layers 263 and 264 are not simultaneously exposed for receiving the electron or other beam and scattering it back to a particle detector, it may not be possible to simultaneously inspect both patterns side by side with the SEM or another particle scanning inspection technique (e.g., 267) or with an atomic force sensing technique. Additionally or alternatively, if top layer 264 is very thick and the focal depth of the SEM scanning beam (represented by symbol 267) is relatively thin, the SEM inspection step may not be able to simultaneously provide sharp focus for the patterns in both of layers 263 and 264 even if the patterns are simultaneously exposed as indicated at the right side of FIG. 2B. It will now be shown how two overlaid patterns may be caused to occur substantially within a same temporary patterns summing plane or layer (TPSL 270), with one pattern formed out of the material of a first hard mask (e.g., layer 263) and the other pattern being formed out of a different material (e.g., the BARC of layer 264).

Figure 3A:
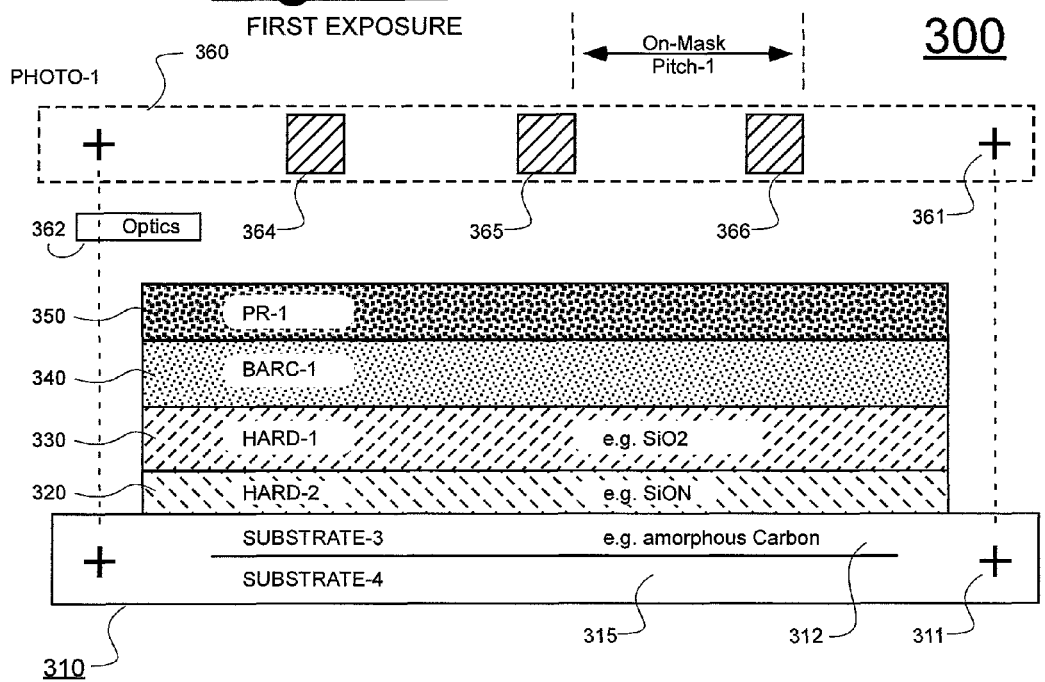
FIG. 3A is a cross sectional side view showing results of a first set of steps carried out during a semiconductor mass production process in accordance with the disclosure, where the first set of steps includes exposure to a first light pattern defined by a first of to-be-overlaid plural photomasks.

Referring next to FIG. 3A and also to steps 110-111, 120-123 of FIG. 1, in one embodiment 100, a batch of in-process wafers are transported (steps 110-111) into a first mask layer(s) depositing station (103) which operates in accordance with the present disclosure. Deposition step 120 represents a first among a series of steps that may be thought of as main processing flow steps 101 because substantially all the wafers of each batch are subjected to them. On the other hand, steps illustrated on the right side of FIG. 1 may be thought of as out-of-flow sampling steps 102 because (in the normal case) only a small percentage (e.g., a randomly sampled handful) of wafers are subjected to these inspection and/or rework steps.

The initially loaded batch of wafers (of input path 111) may include a monocrystalline semiconductor substrate (e.g., silicon) upon which a number of other functional and/or sacrificial layers have been deposited. In the illustrated example of FIG. 3A, each supplied wafer 310 includes a topmost layer 312 composed of amorphous carbon and a second sublayer 315 that is protectively covered by the amorphous carbon layer 312. (The amorphous carbon layer 312 will later serve as a means for transferring a pattern etched into it, with high specificity into a next lower substrate sublayer 315 (e.g., a silicon oxide). Additionally, the supplied wafer 310 has alignment marks (311) formed thereon for enabling downstream lithography tools (e.g., stepper 104 of FIG. 1) to align new photomasks relative to predefined patterns that may already have been formed in the originally supplied substrate 310.

At step 120 a first hard mask material (e.g., SiON or another nitride) is deposited by the first deposition tool to an appropriate thickness on top of the topmost layer 312 of the supplied substrate 310. The first hard mask material (hereafter also called the Hard-2 mask material) and its thickness are selected so as to accomplish a number of downstream process goals as will become apparent. First, the Hard-2 mask material and its thickness are selected so as to be selectively etchable for retaining a DPT pattern that is defined in part by material in a next to-be-deposited layer (the Hard-1 material layer 330). Second, the Hard-2 mask material and its thickness are selected so as to be selectively preferentially etchable relative to the underlying substrate layer 312 (which in one embodiment is composed of amorphous carbon). Thirdly, the Hard-2 mask material and its thickness may be optionally further selected so as to function as a selective polish stop if a CMP (chemical mechanical polishing step) happens to be carried out downstream (see step 147) in the process. Fourthly, the Hard-2 mask material and its thickness are selected so as to function as a selective ashing removal barrier or an acid-based removal barrier if an organic material removal step happens to be carried out downstream (see step 147) in the process.

Next step 121 may be carried out in the same deposition chamber 103 or a next in line deposition chamber of the mass production line. In step 121, a second hard mask material (e.g., SiO2 or another oxide) is deposited to an appropriate thickness on top of the just-deposited Hard-2 layer 320. The second hard mask material (hereafter also called the Hard-1 mask material) and its thickness are selected so as to accomplish a number of downstream process goals as will become apparent. First, the Hard-1 mask material and its thickness are selected so as to be selectively preferentially etchable relative to the Hard-2 layer 320 so that the Hard-1 mask material can retain part of a DPT pattern that will be defined by a photoresist layer (350) that will be deposited downstream in the fabrication line, above the Hard-1 material layer 330. Second, the Hard-1 mask material and its thickness are optionally selected so as to be selectively removable by a CMP removal process (see step 147) if such a removal is desired later downstream in the process 100. While $SiO_2$ and $SiO_xN_y$ (where x and y are selected according to desired chemical and/or mechanical properties) have been given as respective examples for the Hard-1 material layer 330 and the Hard-2 layer 320, these examples are not the only possibilities. The Hard-1 material layer 330 and the Hard-2 layer 320 may be respectively composed of different materials chosen from a set of suitable hard mask materials where the set may include a nitride (e.g., $Si_3N_4$), an oxynitride (e.g., $SiO_xN_y$), an oxide (e.g., $SiO_2$), a semiconductor (e.g., polysilicon), and a refractory metal compound (e.g., TiN, TiW).

After the chemically different, Hard-2 and Hard-1 mask layers have been deposited in respective steps 120 and 121, the in-process batch of wafers (e.g., a batch consisting of 25 in-process wafers) is transferred to a first photolithography station 104. Next in step 122, an organic anti-reflection layer 340 (BARC-1 layer) of appropriate thickness and composition (e.g., Novolac™) is deposited on the Hard-1 layer 330 and planarized, for example by spin-on coating. Next still in step 122, an organic and photosensitive photoresist layer 350 (PR-1 layer) of appropriate thickness and composition (e.g., Novolac plus polymerizable dyes) is deposited on the BARC-1 layer 340 and planarized, for example by spin-on coating. As will be understood by those skilled in the art, this is preparation for an exposure to a polymerizing pattern of radiation (e.g., UV light) that will initiate cross polymerization in predefined desired regions of the PR-1 layer 350.

Figure 3B:
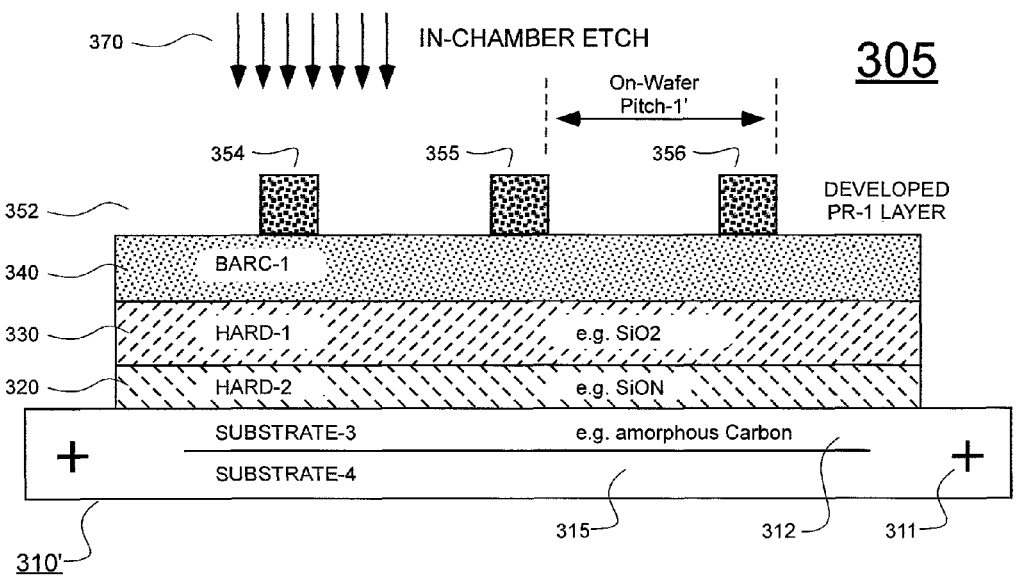
FIG. 3B is a cross sectional side view showing results of a second set of steps including development of a first photoresist (PR-1) layer and use of the developed PR-1 layer as an etch mask.

Next in step 123, and while still in the same first photolithography station 104 (Litho stepper-1), an appropriate photomask 360 containing a predefined first reticle pattern (364-366) and having on-mask alignment marks 361 is automatically aligned to the pre-existing marks 311 on the supplied wafer 310 and appropriate wavelengths of polymerizing radiation (e.g., UV light) are passed through the first photomask (PHOTO-1) 360 and through interposed image reducing optics (362, schematically shown) so as to imprint the pattern of the predefined first reticle pattern (364-366) into the PR-1 layer 350. In one embodiment, the predefined first reticle pattern (364-366) is defined by a plurality of spaced apart lines of chromium having a minimum line-to-line pitch distance of no less than a first predefined distance, Pitch-1 (e.g., 100 nm times XO, where XO is the inverse of the optics image reduction factor). As understood by skilled artisans, the stepper tool 104 steps the reticle pattern across the wafer area while snapping an exposure shot through the mask 360 at each stepper stop. Due to limitations of the stepper optics, lithography materials, and/or stepping mechanism, the minimum line-to-line pitch distance (Pitch-1) cannot be reliably reduced. After exposure to the stepped reticle pattern (354-366), the PR-1 layer 350 is heated (baked) and thereafter cleansed of nonpolymerized portions to thereby develop the illuminated reticle patterns on the in-process wafer. FIG. 3B shows the developed PR-1 layer 352 having features 354, 355 and 356 corresponding to chromium lines 364, 365 and 366 on the photomask of FIG. 3A. The on-wafer minimum line-to-line pitch distance is now denoted as Pitch-1' (e.g., 100 nm).

Figure 4A:
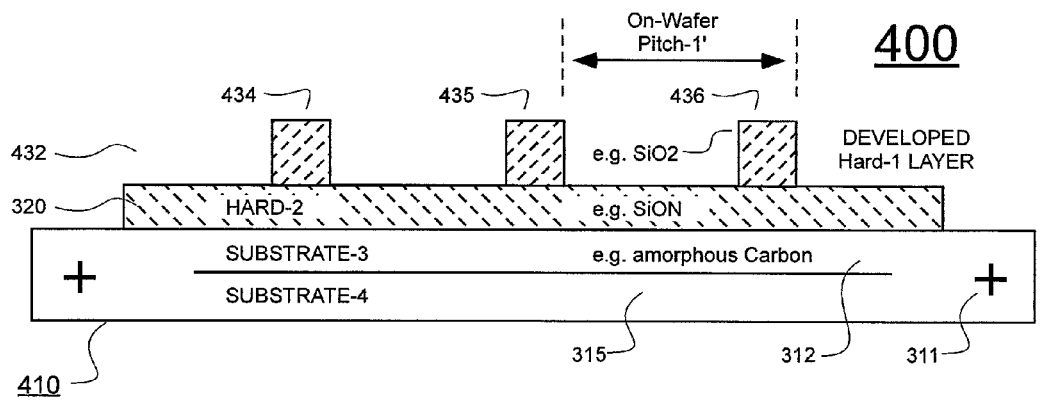
FIG. 4A is a cross sectional side view showing results of a third set of steps including transfer of the pattern of the PR-1 layer to a first hard mask (Hard-1) layer.

Next for step 124, the batch of in-process wafers is transferred to a first etching station (Etcher-1) 105. While in chamber (370), the developed pattern of the PR-1 layer 352 is transferred to the underlying BARC-1 layer 340 by a first etching operation (step 124, e.g., dry plasma etching). Then the transferred pattern of the underlying BARC-1 layer is transferred to the underlying Hard-1 mask layer 330 by a second etching operation (step 125, e.g., a different dry plasma etching process). It is routine to keep the same batch of wafers in the one etching station (Etcher-1) 105 for both etch steps (124 and 125) so as to minimize loss of time for transfer of wafers from one fabrication station to a next. As known to skilled artisans, this reduces loss of time for evacuating and repressurizing the etch chamber when low pressure techniques such as dry plasma etching are used. FIG. 4A shows the developed Hard-1 layer 432 having features 434, 435, 436 corresponding to PR-1 lines 354, 355 and 356 on the developed photoresist layer of FIG. 3B. The on-wafer minimum line-to-line pitch distance is still denoted as Pitch-1' (e.g., 100 nm).

Figure 4B:
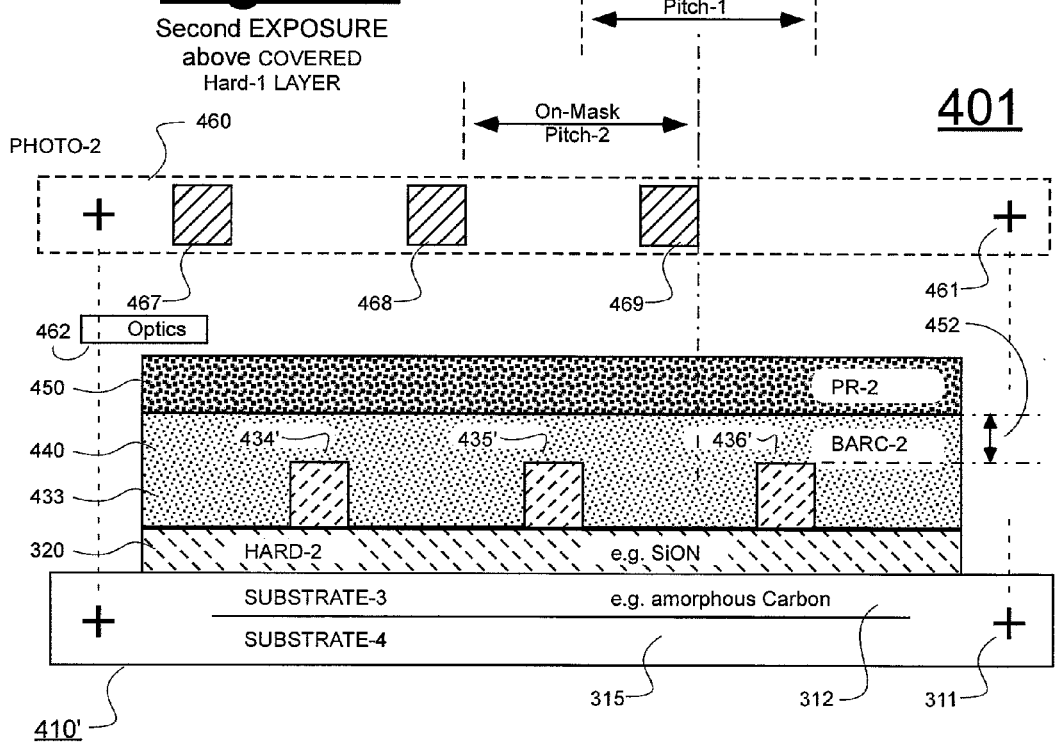
FIG. 4B is a cross sectional side view showing results of a fourth set of steps including exposure to a second light pattern defined by a second of the plural overlay photomasks.

Next for step 130, the batch of in-process wafers is transferred to a second photolithography station 106. Next in step 130, an organic anti-reflection layer 440 (BARC-2 layer of FIG. 4B) of appropriate thickness and composition (e.g., Novolac) is deposited over the developed Hard-1 layer 432 and planarized, for example by spin-on coating. The deposition thickness of the BARC-2 layer 440 is such that it will adequately cover the etched features (e.g., 434'-436') of the developed Hard-1 layer 432 and have an additional height 452 that, in one embodiment, is at least about 20% of the height of the tallest features (e.g., 434'-436') of the developed Hard-1 layer 432. In this way, the BARC-2 layer 440 can be properly planarized and can provide sufficient antireflection properties to allow for good development of the next utilized photomask 460 (PHOTO-2) at its respective wavelength of light exposure (as used in below step 133). At the same time, the BARC-2 material may be optionally chosen so as to be substantially transparent for an optical inspection wavelength used by an optional optical inspection step 134 described below. At the same time, the BARC-2 material may be optionally chosen so as to also be partially opaque (visible) for SEM inspection and for a further optical inspection wavelength used by an optical inspection portion of step 141 described below. In one embodiment, the optical inspection parts of below steps 134 and 141 use an inspection light source operating in the short wavelength end of the visible spectrum (e.g., near the blue-violet end) so as to provide high resolution and the BARC-2 material is selected so as to be at least partially transparent for purpose of visibility of the underlying Hard-1 features 433 at least in this short wavelength portion of the visible spectrum. The specifics of the BARC-2 material 440 and the amount of additional height 452 (if any) can vary from application to application depending on unique requirements of the patterns overlay process and the downstream inspection steps (134, 141). Accordingly the illustrated configuration of FIG. 4B is to be taken as suggestive rather than absolute.

Next still in step 130, an organic and photosensitive photoresist layer 450 (PR-2 layer) of appropriate thickness and composition (e.g., Novolac plus polymerizable dyes) is deposited on the BARC-2 layer 440 and planarized, for example by spin-on coating. As will be understood by those skilled in the art, this is preparation for an exposure to a polymerizing pattern of radiation (e.g., UV light) that will initiate cross polymerization in desired regions of the PR-2 layer 450. At the same time, the PR-2 material may be optionally chosen so that after it is polymerized (hardened) it is substantially opaque (visible) for SEM inspection and for a further optical inspection wavelength used by an optical inspection portion of step 141 described below and depicted by FIG. 5B.

Next in step 133, and while still in the same second photolithography station 106 (Litho stepper-2), an appropriate photomask 460 containing a predefined second reticle pattern (467-469) and having on-mask alignment marks 461 is automatically aligned to the pre-existing marks (e.g., 311) on the supplied wafer 410'. Alternatively or additionally, the second photomask 460 (PHOTO-2) is automatically aligned to the pre-existing alignment patterns (not shown in FIG. 4B, see instead FIGS. 5C and 5D) left behind in the in-scribe regions of the Hard-1 layer 432 by the first used photomask 360 (PHOTO-1). In this way, the second photomask 460 (PHOTO-2) can be more tightly and precisely aligned to the actual alignment of the first photomask (PHOTO-1) 360. However, as mentioned above; despite good intentions and use of care, the attempted alignment of the second photomask 460 (PHOTO-2) to the left-behind on-wafer marks of, for example, the first photomask (PHOTO-1) 360 may still suffer from an undesirable or excess amount of error. The second lithography station 106 (Litho stepper-2) may be subject to temperature related or other process drifts that do not track with drifts of the first lithography station 104 (Litho stepper-1). As such the alignment between the two, to-be-overlaid photomasks (360 and 460) may degrade to a point where predefined margins for mass production error are exceeded. If this is discovered too late in the fabrication process, there is nothing to be done but to discard the in-process wafers and to accept the loss of investment in the error infected, in-process wafers. However, it will be shortly seen that the present disclosure allows for early intervention and one or both of rework and alignment correction.

Continuing with the description of operations in the second lithography station 106 (Litho stepper-2); in step 133 appropriate wavelengths of polymerizing radiation (e.g., UV light) are passed through the second photomask (PHOTO-2) 460 after its alignment, where the polymerizing radiation passes through interposed image reducing optics (462, schematically shown) so as to imprint the pattern of the predefined second reticle pattern (467-469) into the PR-2 layer 450. In one embodiment, the predefined second reticle pattern (467-469) is defined by a plurality of spaced apart lines of chromium having a minimum line-to-line pitch distance of no less than a second predefined distance, Pitch-2 (e.g., 100 nm times XO', where XO' is the inverse of the optics image reduction factor of Litho stepper-1). Once again, as understood by skilled artisans, the second stepper tool 106 steps its reticle pattern across the wafer area while snapping an exposure shot through the mask 460 at each stepper stop position. Due to limitations of the stepper optics, lithography materials, and/or stepping mechanism, the minimum line-to-line pitch distance (Pitch-2) cannot be reliably reduced. However, since the overlaid different photomasks (360, 460) have their patterns staggered by a predefined overlay displacement amount (see the on-wafer Pitch-3' amount of FIG. 5A), it is possible to create an on-wafer minimum line-to-line pitch (Pitch-3' of FIG. 5A) which can be substantially less than the minimum line-to-line pitch distance attainable by each lithography station taken alone (e.g., 104, 106). For example, in one embodiment where the on-wafer Pitch-1' and Pitch-2' amounts are about 100 nm each, the Pitch-3' amount can be about 50 nm. After exposure to the stepping of the overlaid second reticle pattern (466-469), the PR-2 layer 450 is heated (baked) and thereafter cleansed of nonpolymerized portions to thereby develop the illuminated reticle patterns on the in-process wafer. FIG. 5A shows the results after the developed PR-2 layer 452 is cleansed in step 133 to have PR features 567, 568 and 569 corresponding to chromium lines 467, 468 and 469 on the second photomask 460 and after the pattern of the developed PR-2 layer 452 is transferred via etching in step 135 into the underlying BARC-2 layer 442.

It is understood that between steps 133 and 135, the batch of in-process wafers is transferred out of the second lithography station 106 (Litho stepper-2) and into a second etching station (Etcher-2) 107. Routinely, while the batch is still in-chamber in the second etching station 107, the developed pattern of the BARC-2 layer 442 would be transferred to the underlying Hard-2 mask layer 320 by a next etching operation (step 151, e.g., dry plasma etching). However, in accordance with the present disclosure; that is not always done. Instead for every N-minus-M out of N times (where $0 \leq M < N$ and N is a whole number) that batches pass through the second etching station 107, the processing of the given batch is temporarily halted between steps 135 and 151 and one or more sample wafers are randomly selected from the stalled batch and transported (140) out of the etch station 107 for inspection of the alignment between the overlaid photomask patterns.

The values for N and M may vary from application to application. Also there are many variations on how a batch of wafers may be stalled for purposes of carrying out an out-of-etch-chamber sampled alignment inspection. In one variation, one or a few randomly selected wafers out of a given batch of wafers (e.g., 1 out of 25 wafers) are pulled from the batch for transport (140) out of the etch-chamber 107 while the remainder of the given batch is shuttled to a waiting area inside the etch tool. Other batches can be etched during the stall period. In an alternate embodiment, the entire batch of wafers is transported (140) out of the etch-tool 107 and moved to an automated inspection station 141 (station not explicitly shown). In the automated inspection station 141, the one or a few randomly selected wafers are removed from the given batch of wafers (e.g., 1 out of 25 wafers) for inspection while the remainder of the given batch is shuttled to a waiting area (not shown) inside the inspection station 141. Alternatively, all of the wafers in the batch of wafers can be inspected for proper alignment although this would be time consuming. In yet another variation, a sampled few wafers or a whole batch of wafers are every so often (e.g., 4 out of 5 times) moved to the automated inspection station 141 even before entering the second etch-tool 107, where this pre-etch inspection step 134 (detailed below) is limited to optical type microscopy inspection of in-scribe test patterns and does not include SEM inspection of in-die patterns as shall be explained below. The other proportion of the M-N out of N sampled work flow (e.g., the 1 out of the 5 times) first enters the second etch-tool 107 for etching by step 135 and thereafter the sampled flow (136) is moved to the automated inspection station 141 for at least occasional SEM inspections of closely-placed in-die and/or in-scribe features if not also concomitant optical microscope inspection of further apart, in-scribe test pattern features.

Validity of the pre-etch optical inspection step 134 (optional) is dependent on periodic carrying out of the validating SEM inspection step (path 136) so that an acceptable confidence level 138 can be built and maintained by use of validating correlation between optical microscope inspection algorithm results (path 134) and the periodic validating SEM inspection algorithm results (path 136). The advantage of predominantly performing the optical-only inspections (e.g., path 134) and performing the validating SEM inspections (path 136) less often is that SEM inspections tend to consume more time than optical-only inspections (e.g., path 134). Therefore workflow throughput rates can be kept higher if it is statistically acceptable to bypass 137 a significant ratio (e.g., $M/N \geq 1/2$) of the inspections and/or if it is statistically acceptable to bypass 134 a significant proportion (e.g., one out of every two or more) of the SEM utilizing inspections. Contrastingly, if the number of total inspection bypasses 137 reduces toward zero and as the number of included SEM inspections (path 136) increases toward 100%, the time taken for performing the validating SEM inspections (path 136) may become a significant limiting factor on how much production throughput (e.g., good wafers per hour) can be achieved along the main workpiece processing flow 101. Acceptable values for M and N in the total inspection bypass step 137 and acceptable percentages of inspections that bypass the SEM inspections (e.g., via bypass path 134) are empirically determined on the basis of experience with specific products and specific production tools (e.g., steppers). These values are expected to vary from application to application. Accordingly, specific numbers cannot be given here. However, those skilled in the art of statistical product sampling and product validation can work out acceptable numbers on the basis of accumulated experience and accumulated database recordations.

The main point here is that a first sampled percentage of the main workflow (101) of wafers will be subjected to coarse inspections such as by way of optical microscopy-only inspections (e.g., via sampling flow path 134 and/or in step 141) and that a smaller second sampled percentage of the main workflow (101) of wafers will be subjected to finer inspections such as by way of SEM inspections; where the higher resolution SEM inspections (carried out inside inspection station 141) are used to validate by way of correlation the confidence level (138) that can be placed in the coarser resolution inspections (e.g., the optical microscopy-only inspections). As greater confidence (138) is built up in the optical microscopy-only inspections, a greater number of the sampled workflow pieces (wafers) can be tested with the quicker, albeit lower resolution, optical microscopy-only inspection steps (inside inspection station 141) and a smaller number of the sampled workflow piece can be routed for validation by the more time-consuming, but higher resolution SEM inspection steps. Thus the workflow throughput of the system (101/102) can be increased to an extent allowed by statistical analysis and predefined tolerance criteria. Entry into step 140 (FIG. 1) may include a pre-cleansing of the pulled in-process wafer sample(s). FIG. 5A shows such a pre-inspection cleansing as step 139'. The pre-inspection cleansing step 139' may include use of various rinse and dry operations (and/or surface treatment operations) which make the to-be-inspected wafer better suited for inspection by optical microscopy and/or by scanned beam or by scanning nano-tip analysis of the wafer's discernable features. Although FIG. 5A shows the BARC-2 layer 440 as having been selectively etched all the way down to the etch stop provided by the Hard-2 layer 320, such complete etching down to the Hard-2 layer 320 is not a necessary perquisite for purpose of inspection. In some cases, it may be sufficient to partially etch down selectively through the BARC-2 layer 440, at least below the bottom of additional height 452 of FIG. 4B so that the tops of buried Hard-1 features 434'-436' are exposed and project upwardly sufficiently so as to be discerned by and scanned by a scanning electron beam and/or by an atomic force detection tip whereby the alignment of the respective first and second photomask patterns, as represented by the patterned PR-2 sections (567-569 in FIG. 5A) and the partially exposed Hard-1 features 434'-436' can be inspected to determine if their overlay is in accordance with predefined mass production tolerances. Partial etch down of the BARC-2 layer 440 of a sample wafer may be advantageous in that inspection of the partially etched down sample may take place more quickly and in parallel with other processes such as in parallel with completion of the etch down of the BARC-2 layer 440 in the non-sampled wafers of the same batch.

Figure 5D:
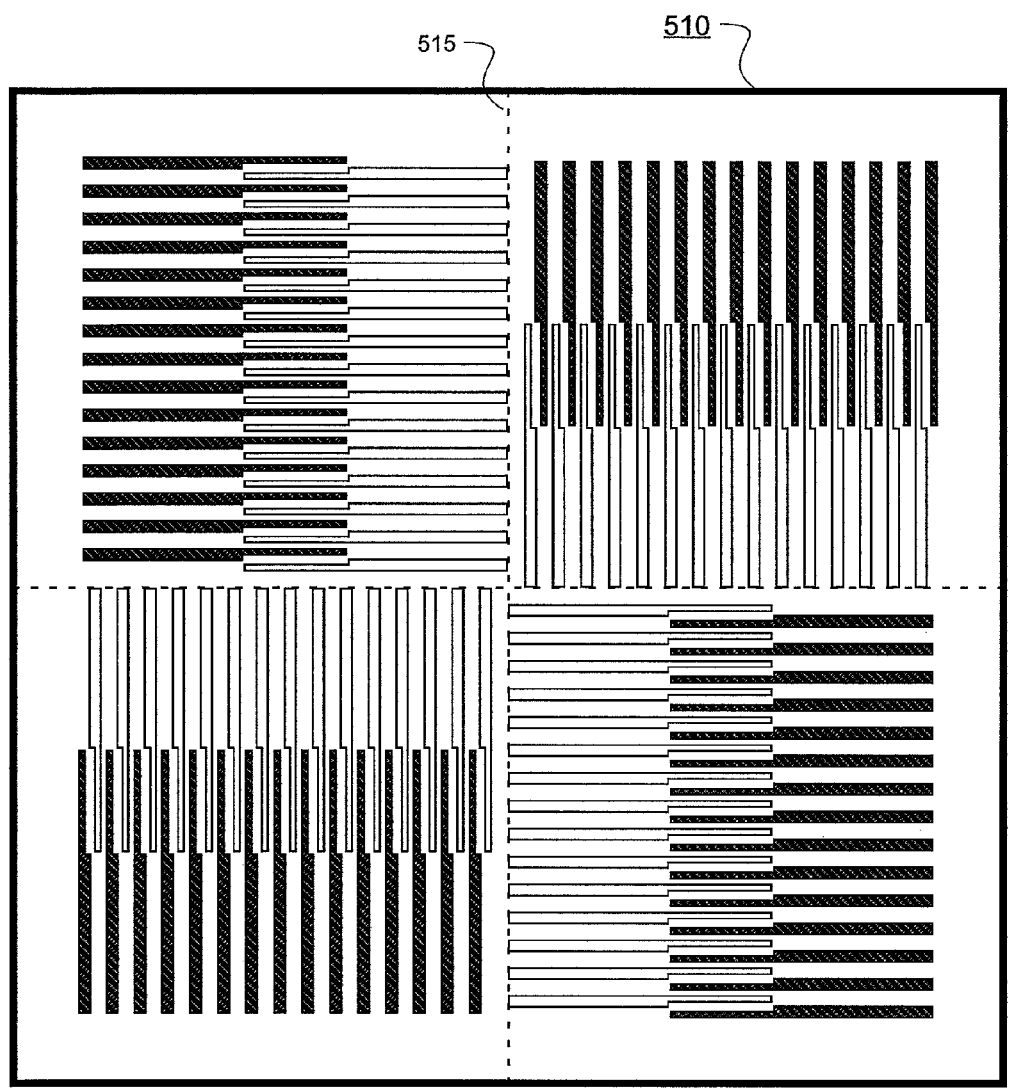
FIG. 5D is a top plan view of a second alignment pattern box that may be defined in in-scribe sections of the temporary patterns summing layer of an in-process IC for verifying alignment of the overlaid patterns by one or both of optical microscope techniques and SEM techniques.

Referring to FIG. 5B, a cleansed wafer 510' that is pulled out of the main process flow 101 for inspection in station 141 will have its temporary patterns summing layer (TPSL) 432" exposed so that an automated SEM inspection tool or another beam scanning or atomic force field scanning tool (nano-tip tool) can be used to scan the exposed features (567', 434''', 568', etc.) within the TPSL layer 432". To this end, it is desirable to include an SEM inspectable CD box (e.g., 505 of FIG. 5C) in an in-scribe region of the temporary patterns summing layer (TPSL) 432". For the example of FIG. 5C, the CD box 505 includes a first set 506 of L-bars that are spaced apart from each other both in the horizontal and vertical directions by the minimum overlay pitch (e.g., Pitch 3' of FIG. 5A, for example 50 nm for a stepper whose on-wafer minimum pitch is 100 nm). More specifically, FIG. 5D shows the case where the SEM inspectable set 506 of L-bars has two L-bars composed of the patterned Hard-1 mask material (e.g., SiO2) and spaced apart from each other by the Pitch-1' distance and where it further has a third L-bar composed of the patterned BARC-2 material (e.g., Novolac with some left over PR-2 material optionally on top of it) and interposed between the first two, Hard-1 L-bars. The SEM inspection toll can be used to very that the middle L-bar of set 506 is aligned to within acceptable tolerances (e.g., 50 nm±3 nm) in the horizontal and vertical directions.

It is understood that the inter-line spacings of the SEM-only inspectable L-bar set 506 are too small to be reliably inspected with the utilized wavelengths of the optical microscopy tool. However, adjacent to the SEM-only inspectable L-bar set 506 there is provided an optically inspectable, second L-bar set 507 whose vertical and horizontal bar spacings are sufficiently large to be resolved by an available, predefined optical microscopy tool. The second L-bar set 507 may be an enlarged copy of the first L-bar set 506 where the scaling factor is predefined. Empirical experience with use of both the SEM inspection on the first L-bar set 506 and optical microscopy inspection on the second L-bar set 507 can be used to develop an error correlation lookup table (in a computer database, not shown) so that an amount of error observed optically in the second L-bar set 507 can be reliably converted to an amount of alignment error otherwise observed in the adjacent first L-bar set 506 by way of SEM inspection. Once such a correlation is built up and proven to be reliable to within acceptable statistical margins of error, the system operator can begin to periodically bypass the fine SEM inspection and rely on only the coarser optical inspection of the second L-bar set 507, thereby increasing the workpiece throughput of the system (101/102).

The exemplary CD box 505 of FIG. 5C further includes an automation alignment mark 508 (e.g., composed of the patterned BARC-2 material) and/or a human viewable layer identifying indicia 509 (e.g., composed of a combination of the patterned BARC-2 material and the patterned Hard-1 material). The automation alignment mark 508 may be used by the automated inspection station 141 for quickly locating and orienting to the SEM and/or optical L-bar sets (506, 507) in the CD box 505. The human viewable, identifying indicia 509 may be used for quickly verifying that a correct batch of wafers is being loaded into the inspection tool 141.

FIG. 5D illustrates an alternate or additional CD box 510 that may be provided in the in-scribe region of the temporary patterns summing layer (TPSL) 432" in accordance with the present disclosure. The dashed cross-hair pattern 515 is not actually present but shows how the CD box 510 is divided into four quadrants by terminal ends of the interdigitated alignment patterns. In one embodiment, the dark-filled ones of the interdigitated fingers are composed of the patterned BARC-2 material and the white-filled fingers are composed of patterned Hard-1 mask material (e.g., SiO2). In one embodiment, the utilized optical inspection tool comprises a KLA-Tencor Archer 10™ Automated Optical Overlay Metrology station that is programmed to include the KLA-Tencor Archer AIM™ software package, both available from KLA-Tencor of California, USA. In one subembodiment, the Archer AIM™ software package is programmed to exclude from the optical analysis windows, the more closely packed and interdigitated regions in each of the four quadrants of the AIM-compatible test pattern.

Figure 5E:
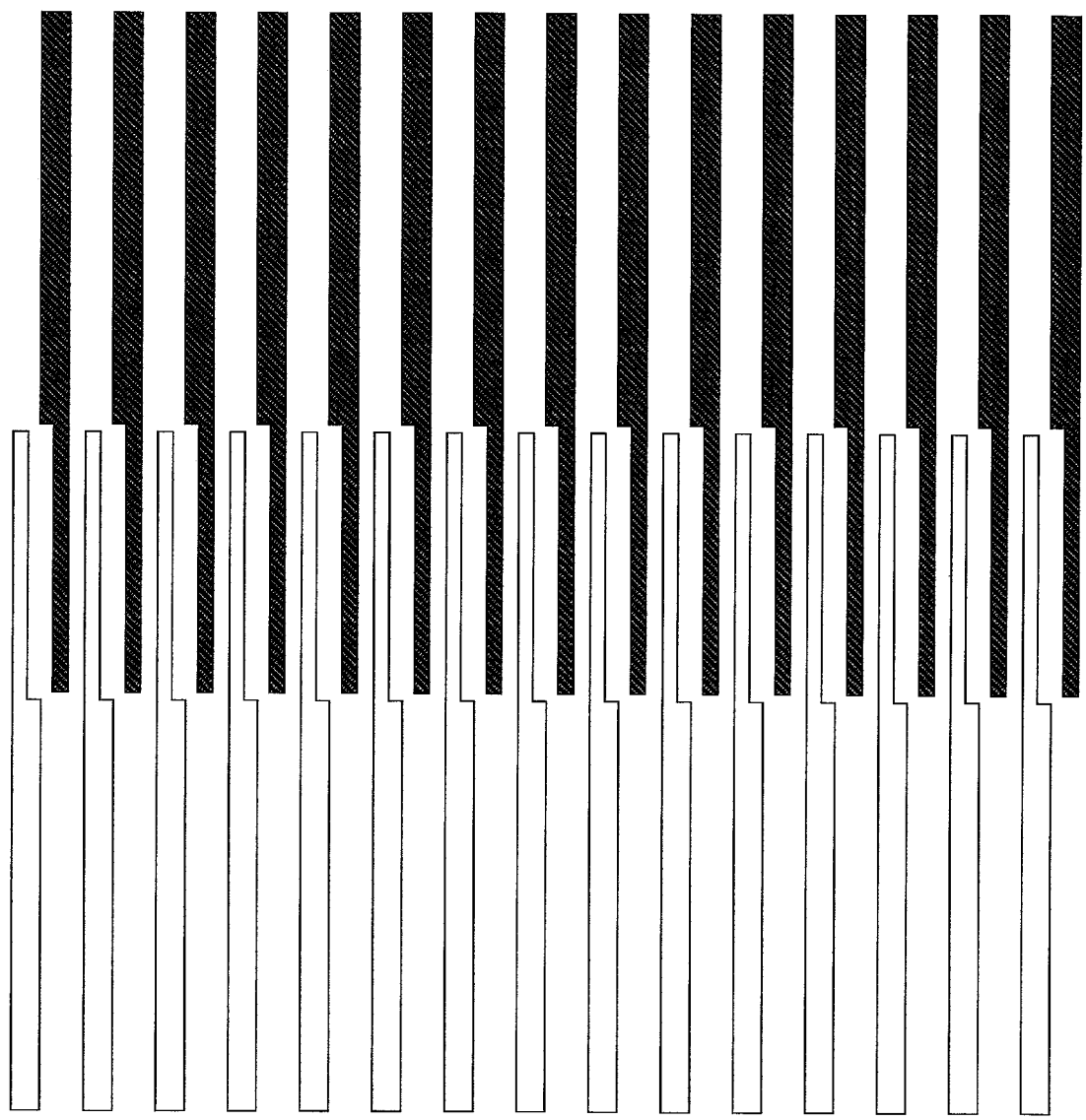
FIG. 5E is a top plan schematic view illustrating how the centers of each of different patterns within a TPSL alignment box such as that of FIG. 5D may be found with aid of automated SEM techniques.
Figure 5F:
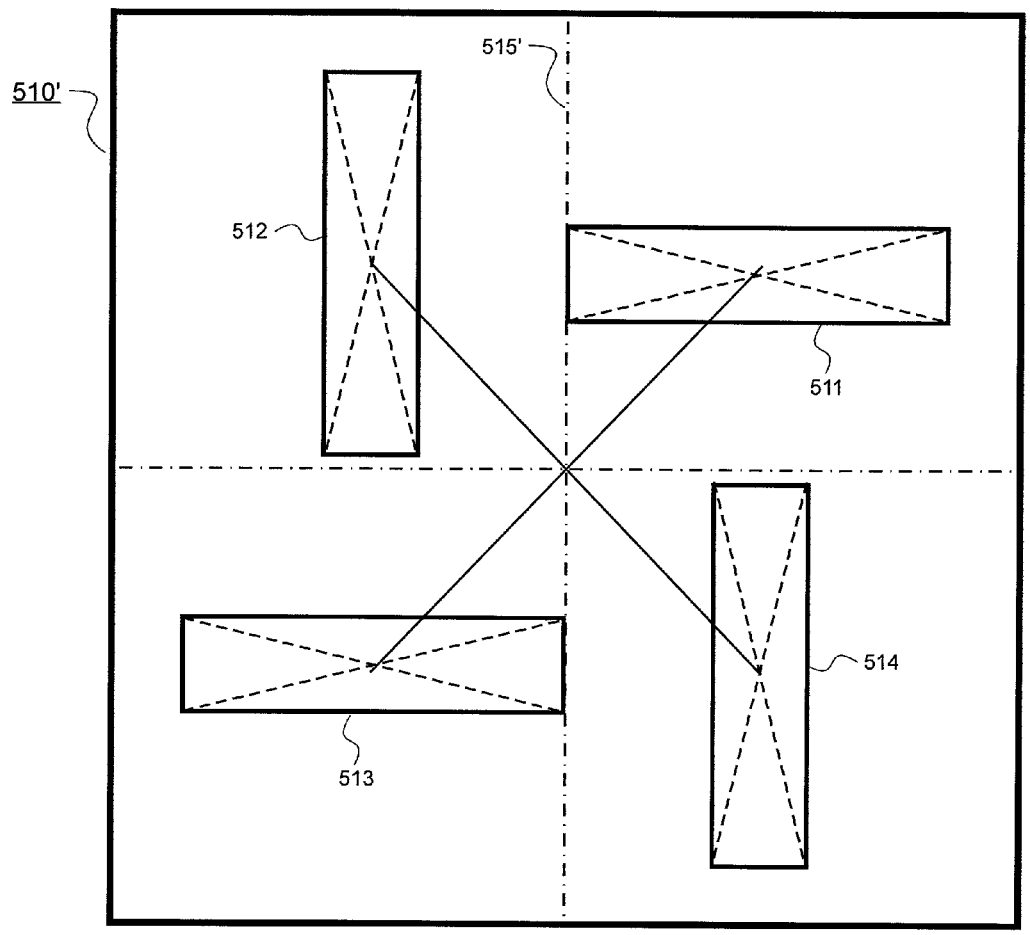
FIG. 5F is an enlarged top plan view of a bar element used in the TPSL alignment box of FIG. 5D.

FIG. 5E is an enlargement showing one of the quadrants in more detail. Note that there are an odd number of black fingers and an odd number of white fingers among the interdigitated fingers. Accordingly, a middle one of the black fingers can be found and a middle one of the white fingers can be found. The center of a thin rectangle portion (522 of FIG. 5G) of the middle one of the black or white fingers can be used to locate a respective center for each of the four quadrants as defined respectively by the patterned Hard-1 mask material (e.g., SiO2) and by the patterned BARC-2 material. FIG. 5F shows how the quadrant centers of one or the other of the patterned Hard-1 mask material (e.g., SiO2) or patterned BARC-2 material can be used to locate a center for the CD box 510' from the alignment view point of the respective one of the patterned Hard-1 mask material (e.g., SiO2) and the patterned BARC-2 material. In one embodiment, during verification an automated determination is made as to how close vertically and horizontally the respective CD box centers 516, 516' are for the patterned Hard-1 mask material and the patterned BARC-2 material. If the SEM-determined distances between the centers 516, 516' are within predefined acceptable margins, the wafers passes inspection (as a YES in step 143 of FIG. 1). If not, the amount of error in the vertical and horizontal directions is recorded (in step 144 of FIG. 1) and the corresponding batch of wafers is pulled for discard or rework depending on the nature of the observed error. The observed error amount is also feedback as a corrective value for one or both of photomask alignment steps 123 and 133 of FIG. 1 so that misalignment among upstream wafers will be reduced.

Figure 5G:
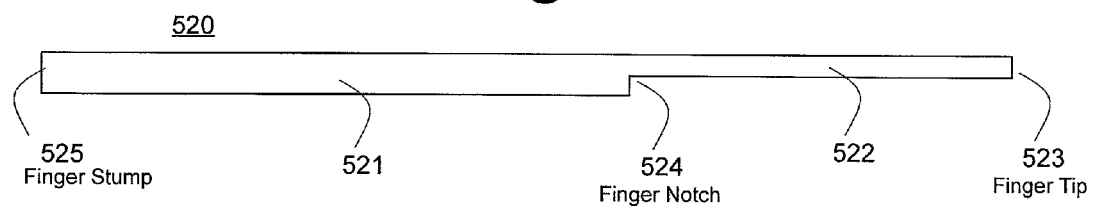
FIG. 5G is an enlarged view of one quadrant of the TPSL alignment box shown in FIG. 5D.

FIG. 5G is an enlargement showing one 520 of the interdigitable fingers that are interdigitated in FIGS. 5D-5E so as to provide in the TPSL 432", areas having the low resolution pitch (e.g., Pitch-1' of FIG. 4A) and areas having the smaller high resolution pitch (e.g., Pitch-3' of FIG. 5A). The illustrated finger 520 comprises a wide rectangular portion 521 abutted against a substantially narrower rectangular portion 522. A finger notch 524 is defined where the wide and narrow rectangular portions 521-522 meet. The notch 524 allows the finger tip 523 of a counterpart finger (not shown) to nestle closely to the narrow rectangular portion 522 of the illustrated finger 520 in accordance with the small pitch (e.g., Pitch-3' of FIG. 5A). It is to be understood that an SEM microscope and/or another such high resolution inspection tool is needed for verifying the fine pitch between the narrow portions 522 of counter-facing fingers while an optical microscope may be used for verifying the substantially coarser pitch present between the wider portions 521 of the same-way facing fingers of a given material (e.g., BARC-2 or Hard-1) in the temporary patterns summing layer. The terminal stumps 525 of the wider finger portions 521 may be used to define a first hypothetical line (e.g., 515 of FIG. 5D) within the corresponding CD box (510). The terminal tips 523 of the narrow finger portions 522 may be used to define respective second hypothetical lines (e.g., long sides in FIG. 5E of hypothetical rectangles 511-514) within the corresponding CD box (510). The notches 524 may be used to define respective third hypothetical lines (e.g., opposed long sides of same hypothetical rectangles 511-514 in FIG. 5E) within the corresponding CD box (510). These unique, on-wafer landmarks may then be used for determining the respective co-alignments of the different patterned materials (e.g., BARC-2 or Hard-1) in the temporary patterns summing layer 432".

Referring again to FIG. 5B, if an excessive misalignment between the overlaid photomask patterns is found in inspection step 141 or one of the overlaid photomask patterns is found to be badly formed, selective erasure methods may be used to remove one or both of the photomask patterns from the temporary patterns summing layer 432" based on the different material compositions used in the TPSL 432" to respectively represent the overlaid photomask patterns. For example, the oxide material that forms TPSL features 434''', 435''' and 436''' in FIG. 5B are resistant to oxidation while the organic materials used in the TPSL to form features 567', 568' and 569' can be easily volatized by exposure to an oxidizing environment (e.g., rapid thermal processing (RTP) plus a flow of oxygen into an ashing chamber). As such, the second of the overlaid photomask patterns can be quickly erased by ashing while leaving behind the first of the overlaid photomask patterns. Other selective methods for removing one but not the other of the overlaid features in the TPSL 432" may be used as appropriate. If it is desirable to also erase the first of the overlaid photomask patterns (the patterned Hard-1 material), chemical mechanical polishing (CMP) may be used where the Hard-2 layer 320 serves as selective polish stop.

Referring back to FIG. 1, if in step 143 it is determined that the automatic inspection process of step 141 detected an excessive misalignment whereby only the most recent of the overlaid photomask patterns (e.g., BARC-2) needs to be erased, then the rework flow 148 for the errant batch of wafers is programmed to direct the transporter 110 to load the batch into step 130 (via path 113) of the main flow after ashing takes place in step 147. On the other hand, if in step 143 it is determined that the automatic inspection process of step 141 detected a malformed earlier one of the overlaid photomask patterns (e.g., Hard-1), then the rework flow 148 for the errant batch of wafers is programmed to direct the transporter 110 to load the batch into step 121 (via path 112) of the main flow after a combination of ashing and CMP removal take place in step 147. Moreover, if CMP removal takes place in step 147 and it is determined that additional Hard-2 material needs to be added, then the rework flow 148 for the errant batch of wafers is programmed to direct the transporter 110 to load the batch into step 120 (via path 111) of the main flow after the CMP removal takes place in step 147.

Step 145 is implemented in the case where the remainder of the batch of wafers was left behind in the second etching station (Etcher-2) 107 while only one or a handful of representative and randomly selected wafers were sent via path 136 (or via path 134) for inspection in station 141. In such a case, when the automated determining step 143 determines that the samples failed to pass inspection, the rest of the batch is normally pulled so that all its wafers will be erased by step 147 and thereafter recoated via step 130. Although not shown, it is to be understood that determining step 143 may also determine to discard a batch of wafers if the error in them is excessive and therefore not correctable in a cost-effective way. Nonetheless, the misalignment information obtained in inspection step 141 is automatically fed back in step 144 to one or both of stepper tools 104 and 106 and where warranted, corrective actions are taken therein for reducing or eliminating the misalignment.

On the other hand, if the automated determining step 143 determines that the samples passed inspection (YES), then the samples proceed to step 149 where they are automatically reunited with their respective batches of wafers inside the temporarily stalled etch tool 107. The etch chamber is depressurized in step 151 and an appropriate etch process (e.g., dry plasma etching) is used to transfer the combination of patterns in the temporary patterns summing layer (TPSL) 432" into the underlying Hard-2 mask 320. The result is seen in FIG. 6 where the patterned Hard-2 features 667, 634, 668, etc., represent the current sum of the photomask patterns overlaid so far. In some instances, it may be desirable to overlay yet a third photomask pattern. In such a case, optional routing path 152 routes the batch of wafers to step 125 for transfer into an underlying Hard-1 layer (not shown) and recoating (in step 130) with new BARC and PR layers and patterning with the third or subsequent overlay mask. It is assumed that a sufficient number of underlying pairs of Hard-1 and Hard-2 layers have been provided ahead of time to support such multi-overlay patterning.

After the first two or more overly patterns have been summed and transferred into a final hard mask layer (e.g., Hard-2 620 of FIG. 6), the batch of wafers is transferred to step 153 where the summed overly patterns are copied into an optional underlying amorphous carbon layer 612. The result is seen in FIG. 7 where the patterned carbon features 767, 734, 768, etc., represent the sum of the overlaid photomask patterns. These are then used to selectively etch lower layers (e.g., 615) of the underlying substrate 710. Thereafter, the sample-wise inspected batches of wafers may proceed via steps 160-161 for further mass production processing and ultimate completion of function integrated circuit chips.

Referring back to FIG. 1, if path 134 is optionally taken after step 133, the sampled wafer will appear similar to what is shown in FIG. 2 except that the PR-2 layer will have been patterned and developed in accordance with the pattern of the Photo-2 mask 460. A sampled wafer that is pulled along optional path 134 will have its patterned Hard-1 material features (e.g., 434'-436' of FIG. 4B) buried under a predefined thickness (452) of not-yet-patterned BARC-2 material 440. Depending on the materials used for the BARC-2 layer 440, for the patterned Hard-1 features (e.g., 434'-436') and on the covering thickness (452) of the BARC-2 layer 440 above the Hard-1 features, it may be possible with certain wavelengths of optical microscopy to peer through the covering thickness (452) of the BARC-2 layer 440 and optically observe the underlying Hard-1 features (e.g., 434'-436') as well as to distinguishably inspect the overlying, patterned PR-2 features (not shown in FIG. 4B) at the same time. It may be further possible to determine with such an optical-only inspection whether the overlaid Photo-1 and Photo-1 patterns are sufficiently aligned relative to one another so as to meet the predefined alignment specifications for the given product (e.g., the to-be mass produced IC). The specific way in which this can be accomplished may vary from application to application. However, in order to validate that the optical-only inspection path 134 continues to provide statistically reliable results and/or in order to recalibrate any realignment conversion factors used in step 144 for reducing misalignment between overlaid photomasks, it is strongly suggested to periodically use inspection path 136 as well and to periodically include use of SEM inspection in that periodically used path 136. In this way a confidence factor 138 can be empirically developed over time and maintained for the correlation between results obtained with the optical-only inspection path 134 and results obtained with the SEM-included inspection path 136. The advantage of using the optical-only inspection path 134 more often and using the SEM-included inspection path 136 less often is that the latter inspection path 136 calls for a halting of operations in the Etcher-2 tool 107 and a transfer of the sample wafer(s) out of the tool 107 for inspection in station 141. By contrast, when path 134 is implemented after processing step 133 (pattern and develop the PR-2 layer), the to-be-inspected sample wafer(s) is/are leaving the Stepper-2 tool 106 anyway. So there is no need to slow down the maximum throughput of a given tool. If path 136 is implemented after processing step 135 (transfer pattern to BARC-2), then the sampling operation does undesirably interfere with maximum wafers per hour throughput rate of the Etcher-2 tool 107. An alternate approach may be to perform step 135 in the Etcher-2 tool 107 but then to perform step 151 (transfer to Hard-2) in a different etch tool (a third etcher, not shown).

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of a first example of a further modification in accordance with the disclosure, the in-scribe test patterns may be other than what are shown in FIG. 5C or 5D. The main point is that the in-scribe test patterns created within the TPSL have at least one coarsely spaced patterned region whose spacings can be measured by a predefined coarse measurement tool (e.g., an automated optical inspection tool like the KLA-Tencor Archer™ tool) and at least one, more finely spaced patterned region whose spacings can be measured by a predefined fine measurement tool (e.g., an SEM). The coarse measurement tool is programmed to automatically avoid the more finely spaced patterned regions of the in-scribe test patterns. The fine measurement tool (e.g., an SEM) is programmed to automatically focus in on the more finely spaced patterned regions of the in-scribe test patterns while not wasting time on the coarsely spaced patterned regions of the in-scribe test patterns. The coarser optical alignment measurements may be taken first, and if those are passed, occasional finer measurement SEM alignment measurements are taken to validate the optical results and/or to update the optical measurement transform tables so that optical measurement error is reduced.

By way of a further example, it is understood that the various automated operations described herein are carried out by appropriately programmed general or special purpose computers, for example those provided with the automated transport, stepper, etch and inspection tools. Accordingly, the present disclosure is understood to cover methods such as configuring instructable automated machines (e.g., computers) to carry out of one or more of the various automated processes described herein. Moreover, the present disclosure is understood to cover manufacture of a computer-readable medium or another form of a software conveyance product or machine-instructing means (including but not limited to, a hard disk, a compact disk, a flash memory stick, a downloading of manufactured instructing signals over a network and/or the like software products) for instructing an instructable machine to carry out one or more of the various automated processes described herein and/or for feeding back inspection results and corrective alignment data from the inspection tool (141) to a database storage and/or to one or more of the stepper tools. As such, it is within the scope of the disclosure to have an instructable machine carry out, and/to provide a software product adapted for causing an instructable machine to carry out one or more machine-implemented methods in accordance with the present disclosure.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein. Descriptions above regarding related technologies are not admissions that the technologies or possible relations between them were appreciated by artisans of ordinary skill in the areas of endeavor to which the present disclosure most closely pertains.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. An in-process plurality of patterned wafers wherein:
(a) each patterned wafer has exposed thereon, a temporary patterns summing layer (TPSL) containing a first set of patterned features composed of a first material and representing a first of overlaid photomask patterns and containing a second set of patterned features composed of a different second material and representing a second of the overlaid photomask patterns, the TPSL being for performing further patterning of the patterned wafer in subsequent processing; and wherein
(b) at least one of the in-process patterned wafers has had its exposed TPSL inspected by way of one or more preselected measurement techniques to verify that the first and second sets of patterned features are positioned relative to at least one another in accordance with a predetermined spacing specification.

2. The in-process plurality of patterned wafers of claim 1 wherein:
(a) the temporary patterns summing layer (TPSL) of each patterned wafer includes an in-scribe test pattern configured for use by one or more of the preselected measurement techniques to verify that the first and second sets of patterned features are positioned relative to at least one another in accordance with the predetermined spacing specification.

3. The in-process plurality of patterned wafers of claim 1 wherein at least one of the first and second materials is a hard-mask material.

4. The in-process plurality of patterned wafers of claim 3 wherein at least one of the first and second materials comprises an oxide and/or a nitride and/or an oxynitride and/or a semiconductor and/or a refractory metal compound.

5. The in-process plurality of patterned wafers of claim 3 wherein at least one of the first and second materials comprises silicon oxide and/or silicon nitride and/or silicon oxynitride.

6. The in-process plurality of patterned wafers of claim 3 wherein at least one of the first and second materials comprises silicon.

7. The in-process plurality of patterned wafers of claim 3 wherein at least one of the first and second materials comprises a refractory metal compound.

8. The in-process plurality of patterned wafers of claim 1 wherein the patterned wafers are in the process which is for fabricating one or more integrated circuits from each wafer.

9. The in-process plurality of patterned wafers of claim 8 the TPSL is for defining patterns to be transferred into an underlying layer of the at least one of the in-process patterned wafers.

10. The in-process plurality of patterned wafers of claim 9 wherein the patterns defined using TPSL are to be transferred using an etch.

* * * * *